US009520526B2

(12) United States Patent
Yamaguchi et al.

(10) Patent No.: US 9,520,526 B2
(45) Date of Patent: Dec. 13, 2016

(54) MANUFACTURING METHOD OF AVALANCHE PHOTODIODE

(71) Applicant: Mitsubishi Electric Corporation, Tokyo (JP)

(72) Inventors: Harunaka Yamaguchi, Tokyo (JP); Susumu Hatakenaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/830,447

(22) Filed: Aug. 19, 2015

(65) Prior Publication Data

US 2016/0155888 A1    Jun. 2, 2016

(30) Foreign Application Priority Data

Nov. 28, 2014 (JP) ................. 2014-242042

(51) Int. Cl.
*H01L 31/18*     (2006.01)
*H01L 31/107*    (2006.01)

(52) U.S. Cl.
CPC ......... *H01L 31/1844* (2013.01); *H01L 31/107* (2013.01)

(58) Field of Classification Search
CPC ............... H01L 31/107; H01L 31/1844; H01L 31/035281; H01L 31/1075; Y02E 10/50
See application file for complete search history.

(56) References Cited

U.S. PATENT DOCUMENTS

| | | | | |
|---|---|---|---|---|
| 6,653,166 B2* | 11/2003 | Ledentsov | ............. | B82Y 10/00 257/12 |
| 6,876,013 B2* | 4/2005 | Okano | ................ | C30B 25/02 257/197 |
| 8,148,229 B2* | 4/2012 | Shiba | ................ | H01L 31/02161 438/380 |
| 2001/0026971 A1 | 10/2001 | Fujita et al. | | |
| 2002/0167022 A1* | 11/2002 | Ledentsov | ............. | B82Y 10/00 257/190 |

(Continued)

FOREIGN PATENT DOCUMENTS

| JP | H09-017737 A | 1/1997 |
|---|---|---|
| JP | 2000-068284 A | 3/2000 |

(Continued)

OTHER PUBLICATIONS

High Gain X Bandwidth Product Over 140-GHz Planar Junction AlInAs Avalanche Photodiodes; Rouvie et al.; IEEE Photonics Technology Letters, vol. 20, No. 6, Mar. 15, 2008.

(Continued)

*Primary Examiner* — Latanya N Crawford
(74) *Attorney, Agent, or Firm* — Studebaker & Brackett PC

(57) ABSTRACT

A manufacturing method of an avalanche photodiode includes: forming a p-type field relaxation layer on a substrate; forming a cap layer on the p-type field relaxation layer; and forming a light absorbing layer on the cap layer, wherein a carbon is doped in the p-type field relaxation layer as a p-type dopant, the p-type field relaxation layer contains Al in a crystal composition, and a temperature-rise process from a growth temperature of the cap layer to a growth temperature of the light absorbing layer is performed in an inactive gas atmosphere without introducing a group V raw material.

3 Claims, 5 Drawing Sheets

(56) References Cited

U.S. PATENT DOCUMENTS

| | | | | |
|---|---|---|---|---|
| 2004/0087055 A1* | 5/2004 | Ledentsov | ............. | B82Y 10/00 |
| | | | | 438/77 |
| 2005/0029541 A1* | 2/2005 | Ko | .................... | H01L 31/03046 |
| | | | | 257/186 |
| 2013/0299936 A1* | 11/2013 | Takemura | ............. | H01L 31/107 |
| | | | | 257/458 |
| 2014/0131827 A1* | 5/2014 | Yamaguchi | ......... | H01L 31/1075 |
| | | | | 257/438 |
| 2015/0221725 A1* | 8/2015 | Tamura | ............... | H01L 29/7786 |
| | | | | 257/194 |

FOREIGN PATENT DOCUMENTS

| | | |
|---|---|---|
| JP | 2002-093818 A | 3/2002 |
| JP | 2014-099467 A | 5/2014 |

OTHER PUBLICATIONS

Heavily Carbon Doped Base InpInGaAs Heterojunction Bipolar Transistors Grown by Two-Step Metalorganic Chemical Vapor Deposition; Jpn. J. Appl. Phys. vol. 35, Pt. 1, No. 12A; Ito et al.; Dec. 1996.

* cited by examiner

MANUFACTURING METHOD OF AVALANCHE PHOTODIODE

BACKGROUND OF THE INVENTION

Field of the Invention

The present invention relates to a manufacturing method of an avalanche photodiode capable of improving the activation rate of the carbon added to the p-type field relaxation layer.

Background Art

In electronic devices and optical devices requiring a local high-density p-type semiconductor layer, carbon with low diffusion is often used as a dopant. However, since hydrogen is taken into a crystal at carbon doping, there is a problem of lowering of a carbon activation rate. On the contrary, in electronic devices represented by hetero bipolar transistors, by performing annealing in a furnace during crystal growth, the activation rate of a carbon dope layer can be improved, and favorable characteristics and reliability can be obtained (see Japanese Patent Laid-Open No. 2000-68284 and H. Ito et al., Jpn. J. Appl: Phys. Vol. 35 (1996), pp. 6139 to 6144, for example).

On the other hand, as an example in which the carbon dope layer is used in the optical device, an electron multiplication type avalanche photodiode with low noise and high sensitivity has been realized (see IEEE PHOTONICS TECHNOLOGY LETTERS, VOL. 20, NO. 6, Mar. 15, 2008, for example). In order to control an avalanche mode, a p-type AlInAs field relaxation layer doped with carbon at high density is used, and it indicates superiority over the doping of Zn or Be which is a general p-type dopant in terms of characteristics. However, there is a concern that the lowered activation rate of carbon in the field relaxation layer caused by hydrogen in the carbon dope layer deteriorates reliability. Thus, in order to improve the activation rate of the p-type semiconductor layer doped with carbon, a sequence for growing an InGaAs light absorbing layer at a high temperature after growth of the field relaxation layer is preferable. For example, as illustrated in FIG. 6, execution of annealing can be considered between the growth of the field relaxation layer and the growth of the light absorbing layer. At this time, it is preferable that heat damage at temperature rise is relaxed by covering a surface of the field relaxation layer by InGaAs or InGaAsP (see Japanese Patent Laid-Open No. 2014-99467, for example).

SUMMARY OF THE INVENTION

However, as illustrated in FIG. 7, under the above-described condition, the longer the annealing time gets, the poorer the activation rate of carbon in the field relaxation layer becomes to the contrary. As the annealing time becomes longer, a rise of hydrogen concentration is observed, and this is considered to be caused by a group V raw material such as $AsH_3$ introduced into a device during the growth of the light absorbing layer immediately after that. That is because, since hydrogen which is an inactive gas is not decomposed around 600° C., it is difficult to assume that the hydrogen having been introduced into the device is taken into the crystal. On the other hand, since the group V gas is not introduced in annealing, heat damage is applied to the field relaxation layer, and the longer the annealing time gets, the larger this damages becomes. Thus, it is expected that hydrogel radicals decomposed from $AsH_3$ are taken into the field relaxation layer easily. A cause of deterioration of the carbon activation rate as the annealing time becomes longer is considered to be associated with deterioration of crystalline caused by such heat damage.

In view of the above-described problems, an object of the present invention is to provide a manufacturing method of an avalanche photodiode capable of improving the activation rate of the carbon added to the p-type field relaxation layer.

According to the present invention, a manufacturing method of an avalanche photodiode includes: forming a p-type field relaxation layer on a substrate; forming a cap layer on the p-type field relaxation layer; and forming a light absorbing layer on the cap layer, wherein a carbon is doped in the p-type field relaxation layer as a p-type dopant, the p-type field relaxation layer contains Al in a crystal composition, and a temperature-rise process from a growth temperature of the cap layer to a growth temperature of the light absorbing layer is performed in an inactive gas atmosphere without introducing a group V raw material.

In the present invention, the temperature rise process from the growth temperature of the cap layer to the growth temperature of the light absorbing layer is performed in the inactive gas atmosphere without introducing a group V raw material. Thus, occurrence of taking of hydrogen into the field relaxation layer caused by the group V raw material at growth of the light absorbing layer after the temperature-rise process can be prevented. As a result, the activation rate of the carbon added to the field relaxation layer can be improved.

Other and further objects, features and advantages of the invention will appear more fully from the following description.

DETAILED DESCRIPTION OF THE PREFERRED EMBODIMENTS

Figure 1:
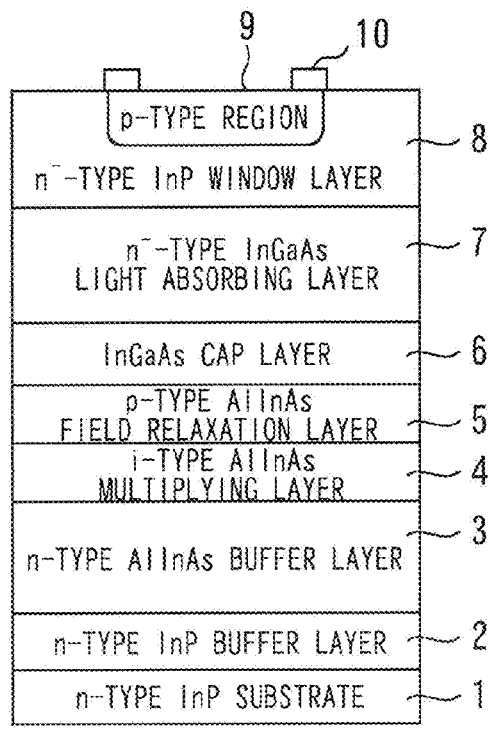
FIG. 1 is a sectional view illustrating an avalanche photodiode according to an embodiment of the present invention.

FIG. 1 is a sectional view illustrating an avalanche photodiode according to an embodiment of the present invention. On an n-type InP substrate 1, an n-type InP buffer layer 2, an n-type AlInAs buffer layer 3, an i-type AlInAs multiplying layer 4, a p-type AlInAs field relaxation layer 5, a InGaAs cap layer 6, an n⁻-type InGaAs light absorbing layer 7, and an n⁻-type InP window layer 8 are laminated in order. A p-type region 9 is formed in the n⁻-type InP window layer 8. A p-type InGaAs contact layer 10 is formed on the p-type region 9.

The n-type InP buffer layer 2 has a thickness of 0.1 to 1 μm and carrier density of 3 to 5×10¹⁸ cm⁻³. The n-type AlInAs buffer layer 3 has a thickness of 0.1 to 0.5 μm and carrier density of 3 to 5×10¹⁸ cm⁻³. The i-type AlInAs multiplying layer 4 has a thickness of 0.1 to 0.5 μm. The p-type AlInAs field relaxation layer 5 has a thickness of 0.05 to 0.15 μm and carrier density of 0.5 to 1×10¹⁸ cm⁻³. The InGaAs cap layer 6 has a thickness of 0.05 to 0.5 μm. The n⁻-type InGaAs light absorbing layer 7 has a thickness of 1 to 2 μm and carrier density of 1 to 5×10¹⁵ cm⁻³. The n⁻-type InP window layer 8 has a thickness of 0.5 to 1 μm and carrier density of 0.01 to 0.1×10¹⁵ cm⁻³.

The p-type InGaAs contact layer 10 has a thickness of 0.1 to 0.5 μm and carrier density of 1 to 5×10¹⁸ cm⁻³.

Figure 2:
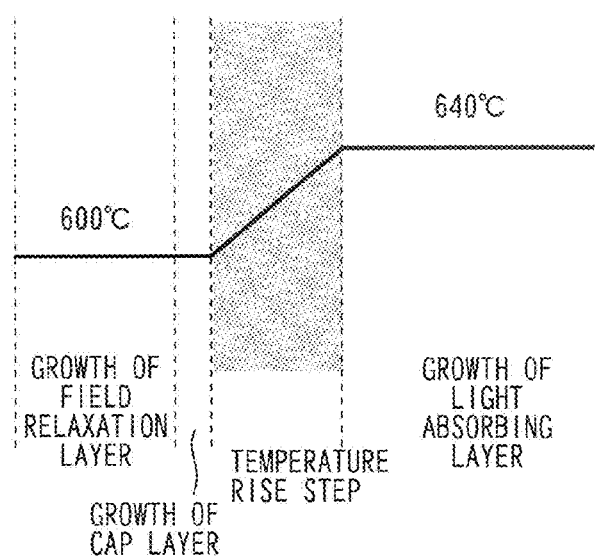
FIG. 2 is a view illustrating a crystal growth sequence of the avalanche photodiode according to the embodiment of the present invention.

Subsequently, a manufacturing method of the avalanche photodiode according to the embodiment of the present invention will be described. Growing methods of each semiconductor layer include a Metal Organic Vapor Phase Epitaxy (MOVPE) method, a Molecular Beam Epitaxy (MBE) method and the like. FIG. 2 is a view illustrating a crystal growth sequence of the avalanche photodiode according to the embodiment of the present invention.

First, the n-type InP buffer layer 2, the n-type AlInAs buffer layer 3, and the i-type AlInAs multiplying layer 4 are made to grow in order on the n-type InP substrate 1 at a growth temperature of 630° C. Subsequently, the growth temperature is lowered to the vicinity of 600° C., and the carbon-doped p-type AlInAs field relaxation layer 5 is made to grow. Subsequently, in order to protect damage at a temperature rise, the InGaAs cap layer 6 is made to grow at the same growth temperature as that of the P-type AlInAs field relaxation layer 5. Subsequently, the growth temperature is raised to 640° C. After the temperature rise, the n⁻-type InGaAs light absorbing layer 7, the n⁻-type InP window layer 8, and the p-type InGaAs contact layer 10 are made to grow in order.

A temperature rise process from the growth temperature of 600° C. of the InGaAs cap layer 6 to the growth temperature of 640° C. of the n⁻-type InGaAs light absorbing layer 7 is performed in an inactive gas atmosphere such as hydrogen without introducing AsH₃ which is a group V raw material into the device.

Figure 3:
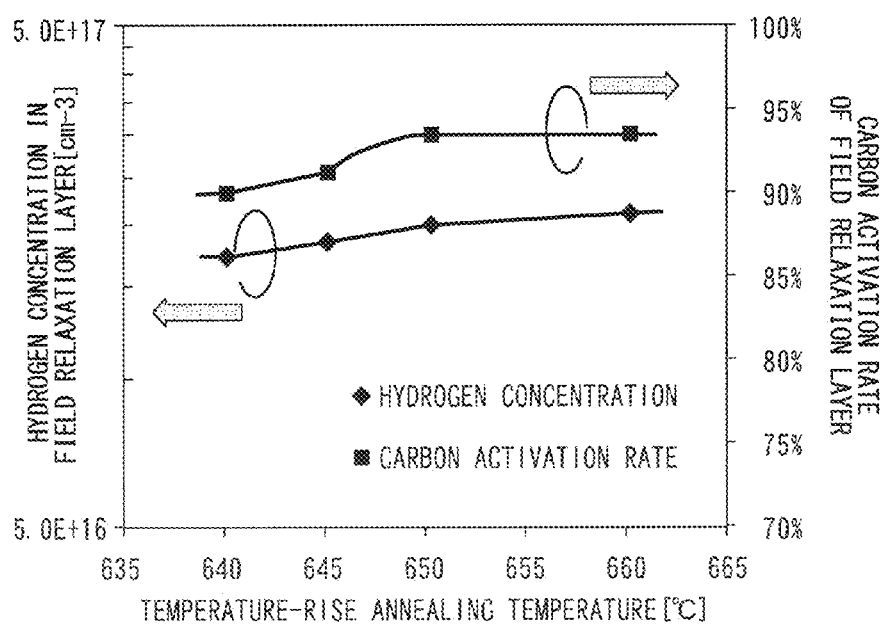
FIG. 3 is a view illustrating a correlation among a temperature-rise annealing temperature, a carbon activation rate of the field relaxation layer, and hydrogen concentration in the field relaxation layer.

FIG. 3 is a view illustrating a correlation among a temperature-rise annealing temperature, a carbon activation rate of the field relaxation layer, and hydrogen concentration in the field relaxation layer. The activation rate of the carbon doped in the field relaxation layer is improved by the annealing effect in the inactive gas atmosphere in the temperature rise process. The carbon activation rate is changed not by temperature rise time but by the temperature-rise annealing temperature. The temperature-rise annealing temperature becomes the same as the growth temperature of the light absorbing layer. The carbon activation rate is saturated in the vicinity of the temperature-rise annealing temperature at 650° C., and in the case of the temperature-rise annealing temperature at 660° C., the carbon activation rate stays as it is while the hydrogen concentration in the field relaxation layer slightly rises. This suggests that, by raising the temperature-rise annealing temperature, heat damage to the field relaxation layer is present as trade-off. Crystalline cannot be maintained even if the growth temperature of the light absorbing layer is raised too high, and thus, the temperature-rise annealing temperature is preferably set to the vicinity of 640 to 660° C. by considering the carbon activation rate and the hydrogen concentration of the field relaxation layer.

A result of analysis of the carbon concentration and the hydrogen concentration in the field relaxation layer by a Secondary Ion Mass Spectroscopy (SIMS) when an annealing condition is changed within a temperature range of 640 to 660° C. is illustrated in Table 1. In carbon doping, not only carbon but also hydrogen is taken in at the same time, and its amount usually decreases as annealing progresses. However, by performing crystal growth immediately after the annealing in a growth sequence, the hydrogen concentration in the carbon doping layer in a lower part might be raised by the group V raw material. Since this situation appears particularly remarkably when the damage has been caused by the annealing, a rise of the hydrogen concentration is found also in a temperature range of this embodiment. Since the carbon activation rate in the field relaxation layer is expected to drop by an increase of the hydrogen concentration and also by excessive application of annealing, it is preferable that a ratio of hydrogen to carbon (H/C ratio) contained in the field relaxation layer after the temperature-rise process is adjusted so as to be 0.10 to 0.13.

TABLE 1

| temperature-rise annealing temperature [° C.] | carrier density [cm⁻³] | carbon concentration [cm⁻³] | hydrogen concentration [cm⁻³] | H/C ratio | activation rate |
| --- | --- | --- | --- | --- | --- |
| 640 | 1.57E+18 | 1.74E+18 | 1.8E+17 | 0.10 | 90% |
| 645 | 1.58E+18 | 1.73E+18 | 1.9E+17 | 0.11 | 91% |
| 650 | 1.57E+18 | 1.68E+18 | 2.0E+17 | 0.12 | 93% |
| 660 | 1.56E+18 | 1.67E+18 | 2.1E+17 | 0.13 | 93% |

Figure 4:
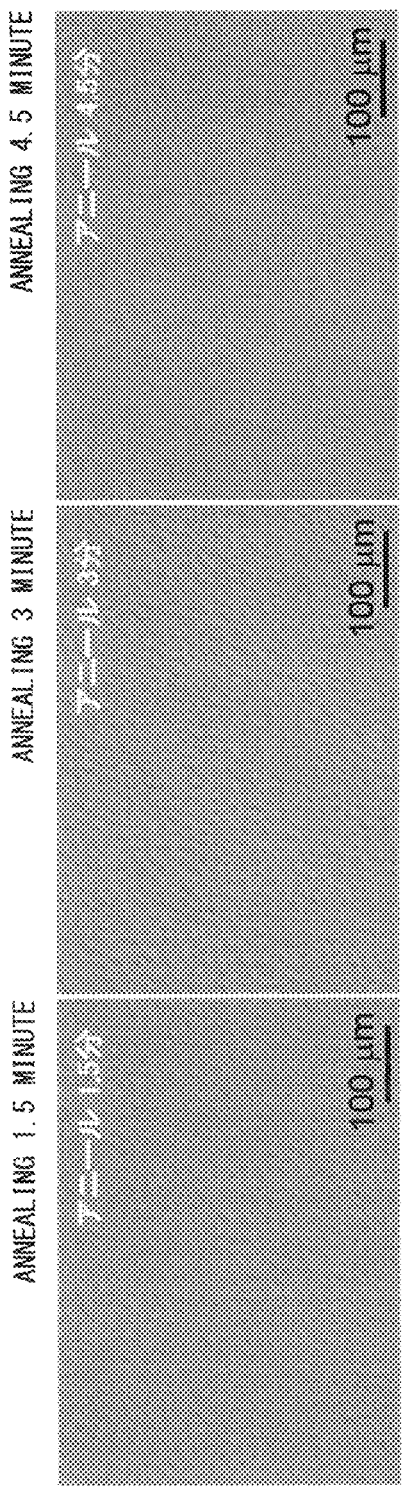
FIG. 4 is a view illustrating a surface state when annealing is performed after the temperature of the InGaAs absorbing layer is raised to the growth temperature in the temperature rise process.
Figure 5:
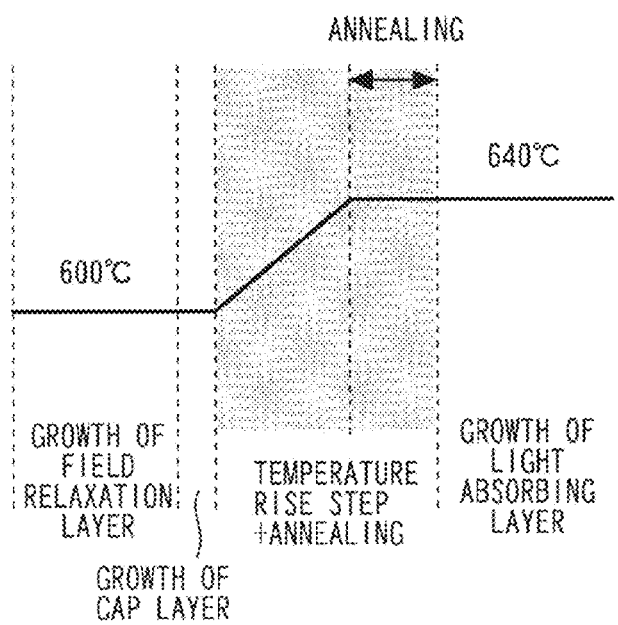
FIG. 5 is a view illustrating a growth sequence when annealing is performed after the temperature of the InGaAs absorbing layer is raised to the growth temperature in the temperature rise process.
Figure 6:
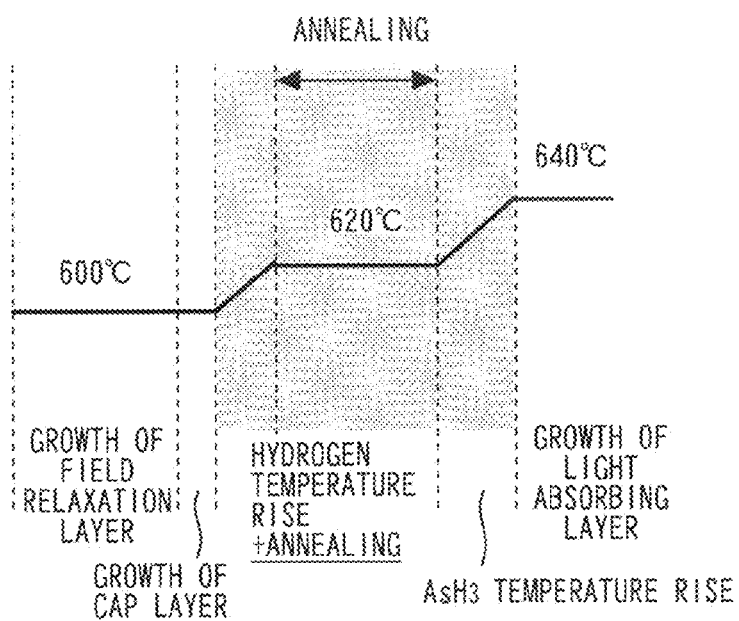
FIG. 6 is a view illustrating a crystal growth sequence of the avalanche photodiode wherein the annealing is performed in situ.
Figure 7:
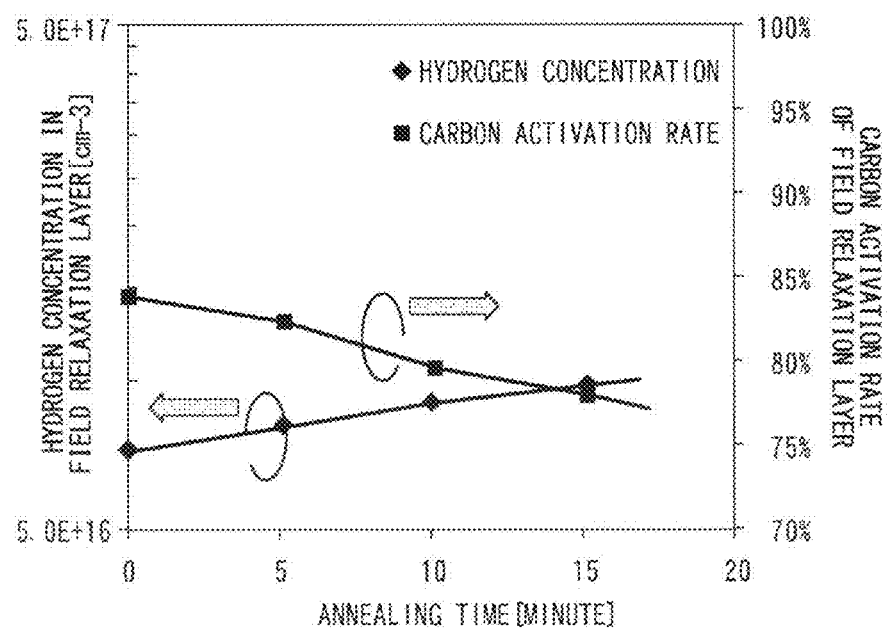
FIG. 7 is a view illustrating a correlation among an annealing time, a carbon activation rate of the field relaxation layer, and hydrogen concentration in the field relaxation layer.

FIG. 4 is a view illustrating a surface state when annealing is performed after the temperature of the InGaAs absorbing layer is raised to the growth temperature in the temperature rise process. FIG. 5 is a view illustrating a growth sequence when annealing is performed after the temperature of the InGaAs absorbing layer is raised to the growth temperature in the temperature rise process. It is known that irregularity found on the surface increases as time elapses. This is considered to be caused by removal of the group V from the crystal surface. By prolonging the annealing time, deterioration of not only the activation rate but also the surface state is concerned about. Therefore, after the temperature is raised to the growth temperature of the n⁻-type InGaAs light absorbing layer 7 in the temperature rise process, it is preferable that annealing is not performed, and growth of the n⁻-type InGaAs light absorbing layer 7 is started.

As described above, in this embodiment, the temperature rise process from the growth temperature 600° C. of the InGaAs cap layer 6 to the growth temperature 640° C. of the n⁻-type InGaAs light absorbing layer 7 is performed in the inactive gas atmosphere such as hydrogen without introducing $AsH_3$ which is a group V raw material into the device. As a result, occurrence of taking of hydrogen into the p-type AlInAs field relaxation layer 5 caused by $AsH_3$ at growth of the n⁻-type InGaAs light absorbing layer 7 after the temperature-rise process can be prevented. As a result, the activation rate of the carbon added to the p-type AlInAs field relaxation layer 5 can be improved.

The material of the field relaxation layer is not limited to AlInAs but it may be AlGaInAs. Moreover, it does not have to be a single layer but may be a laminated or super-lattice structure. It is only necessary that the growth temperature of the cap layer is lower than the absorbing layer growth temperature but preferably higher than the growth temperature of the field relaxation layer. The material of the cap layer is not limited to InGaAs but may be a crystal material containing InP, InGaAsP or Al in a crystal composition. The material of the light absorbing layer is not limited to InGaAs but may be InGaAsP, AlGaInAs, InGaAsSb or the like. The contact layer is not limited to doping by impurities but may be formed by Zn diffusion. The substrate is not limited to an n-type InP substrate but may be subjected to flow growth as above on a semi-insulating substrate. Moreover, if the lamination structure of the diode is reversed and growth is performed from the p-type InGaAS contact layer 10, the same effect is obtained by forming a similar sequence in temperature rise of the growth temperature to the layer (i-type AlInAs multiplication layer 4 or the like, for example) after the growth of the p-type AlInAs field relaxation layer 5.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-242042, filed on Nov. 28, 2014 including specification, claims, drawings and summary, on which the Convention priority of the present application is based, is incorporated herein by reference in its entirety.

What is claimed is:

1. A manufacturing method of an avalanche photodiode comprising:
    forming a p-type field relaxation layer on a substrate;
    forming a cap layer on the p-type field relaxation layer; and
    forming a light absorbing layer on the cap layer,
    wherein a carbon is doped in the p-type field relaxation layer as a p-type dopant,
    the p-type field relaxation layer contains Al in a crystal composition, and
    a temperature-rise process from a growth temperature of the cap layer to a growth temperature of the light absorbing layer is performed in an inactive gas atmosphere without introducing a group V raw material.

2. The manufacturing method of the avalanche photodiode of claim 1, wherein a ratio of hydrogen to carbon contained in the p-type field relaxation layer after the temperature-rise process is 0.10 to 0.13.

3. The manufacturing method of the avalanche photodiode of claim 1, wherein after a temperature is raised to the growth temperature of the light absorbing layer in the temperature rise process, annealing is not performed, and growth of the light absorbing layer is started.

* * * * *